(12) United States Patent
Hall et al.

(10) Patent No.: US 11,674,221 B2
(45) Date of Patent: Jun. 13, 2023

(54) EROSION / CORROSION RESISTANT BARRIER COATING

(71) Applicants: Conax Technologies, Buffalo, NY (US); Alfred University, Alfred, NY (US)

(72) Inventors: Matthew M. Hall, Mendon, NY (US); Timothy Keenan, Wellsville, NY (US); Lana Margaret Placek, Niagara Falls, NY (US); Scott Michael Kroon, Orchard Park, NY (US); William Sean Halligan, Boston, NY (US); Michael Edward Ferraro, Lockport, NY (US)

(73) Assignees: CONAX TECHNOLOGIES, Buffalo, NY (US); Alfred University, Alfred, NY (US)

( * ) Notice: Subject to any disclaimer, the term of this patent is extended or adjusted under 35 U.S.C. 154(b) by 993 days.

(21) Appl. No.: 15/852,399

(22) Filed: Dec. 22, 2017

(65) Prior Publication Data

US 2018/0155828 A1   Jun. 7, 2018

Related U.S. Application Data

(60) Provisional application No. 62/412,299, filed on Oct. 25, 2016.

(51) Int. Cl.
*C23C 16/44* (2006.01)
*C03C 17/22* (2006.01)
*C23C 18/12* (2006.01)

(52) U.S. Cl.
CPC .......... *C23C 16/4404* (2013.01); *C03C 17/22* (2013.01); *C23C 18/127* (2013.01); *C23C 18/1216* (2013.01); *C03C 2217/286* (2013.01); *C03C 2218/111* (2013.01)

(58) Field of Classification Search
None
See application file for complete search history.

(56) References Cited

U.S. PATENT DOCUMENTS

| 3,754,980 | A | 8/1973 | Malmendier |
| 7,166,165 | B2 | 1/2007 | Halpin |
| 2002/0011211 | A1* | 1/2002 | Halpin .................. C03C 17/225 |
| | | | 118/715 |
| 2007/0119377 | A1 | 5/2007 | Halpin |

(Continued)

FOREIGN PATENT DOCUMENTS

| CN | 101208378 A | 6/2008 |
| CN | 102010660 A | 4/2011 |

OTHER PUBLICATIONS

Office Action for Chinese Application No. 201780080340.1 dated Apr. 29, 2022 (8 pages).

*Primary Examiner* — Xiaobei Wang
(74) *Attorney, Agent, or Firm* — Harness, Dickey & Pierce, P.L.C.

(57) ABSTRACT

Disclosed are barrier coatings for fused silica components used in semiconductor processing. In particular, the present disclosure concerns protective substrate-barrier coatings composed of corrosion-resilient metal compounds which provide superior resistance to erosion/corrosion when a coated substrate is subjected to the acidic environments at elevated temperatures typical for semiconductor processing.

27 Claims, 8 Drawing Sheets

(56) References Cited

U.S. PATENT DOCUMENTS

| | | | |
|---|---|---|---|
| 2007/0248832 A1* | 10/2007 | Maeda | C23C 4/06 428/457 |
| 2011/0159210 A1 | 6/2011 | Patrovsky | |
| 2015/0147482 A1* | 5/2015 | Kang | C23C 16/45525 427/535 |
| 2016/0108512 A1* | 4/2016 | Medvedovski | C23C 10/02 427/314 |

* cited by examiner

EROSION / CORROSION RESISTANT BARRIER COATING

FIELD OF THE INVENTION

The present disclosure relates generally to compositions and methods pertaining to barrier coating compositions. In particular, the present disclosure concerns protective substrate-barrier coatings composed of corrosion-resilient metal compounds and thixotropic matrix components, which provide superior resistance to erosion/corrosion when a coated substrate is subjected to acidic environments at elevated temperatures.

BACKGROUND

The following description is provided to assist the understanding of the reader. None of the information provided or references cited is admitted to be prior art.

Semiconductor reactors are operated at relatively high temperatures. The reactor can be frequently cycled up and down from these relatively high temperatures to relatively cold temperatures. Thermocouples are often used to monitor temperatures within the reactor. However, because of the corrosive environments present in the reactor, the thermocouple is typically surrounded by a protective sheath. For example, the thermocouple is coaxially inserted into the protective sheath such that the heat-sensing junction of the thermocouple is placed adjacent to the end of the protective sheath. Accordingly, the thermocouple senses the temperature of the reactor through the protective sheath. Such sheaths should be made of a material that withstands high temperatures and thermal cycling as well as the corrosive processing environment. Further, the sheath material should have acceptable thermal conductivity, whereby the sheathed thermocouple will rapidly react to temperature fluctuations. For semiconductor processing applications, the protective sheath is desirably chemically inert and of a suitable chemical purity to avoid contaminating the wafer during processing. See U.S. Pat. No. 7,166,165, which is incorporated herein by reference in its entirety.

Thermocouples used to measure temperature within a semiconductor reactor chamber are typically protected with fused silica sheaths. And, while such fused silica sheaths may possess certain functionality with respect to thermocouple protection during wafer processing, in corrosive environments, frequent and continued thermal cycling of the fused silica sheath—in many instances reaching temperatures of 1000° C. or more—can cause erosion/corrosion of the fused silica sheath. Some processes, like epitaxy, often occur at temperatures of 1150° C. or higher. Sheath integrity within semiconductor reactors are typically compromised from attack of the devitrified surfaces by process related chemicals, such as HCl and chloride processing gasses. In many cases the resulting erosion/corrosion ultimately causes the sheath to lose its protective function leading to subsequent failure of the thermocouple, necessitating its replacement.

In addition to the fused silica thermocouple sheaths, semiconductor reaction chambers comprise many other fused silica components including but not limited to the chamber itself. These fused silica components are subject to the same temperature cycling and corrosive environment mentioned above during wafer processing and thus subject to similar erosion/corrosion.

The need to replace thermocouples, and various other chamber components which have failed due to erosion/corrosion, imparts reactor downtime in concert with significant costs concerning replacement of attendant thermocouple components. Replacing thermocouples and other components requires an intrusion into the chamber which can result in undesirable particle generation. In addition, there is significant time and expense in returning the reactor to the operating conditions necessary to produce the desired film properties on the wafers being coated.

U.S. Pat. No. 3,754,980 discloses a devitrification-resistant glaze for application to high-silica glasses, where the glaze is effective in preventing/inhibiting surface devitrification at elevated temperatures under highly alkaline conditions. Using a weight percentage by oxide, the preferred coating composition disclosed in the '980 patent has the ranges from about 0-50% $SiO_2$, 0-85% $Al_2O_3$, and 15-100% $Ta_2O_5$, which is applied to a glass substrate in the form of an aqueous slurry, at a preferred pH between 8 and 9, that is subsequently dried and fired. The thickness of the resulting vitreous glaze is about 10-50 µm.

U.S. Patent Application Publication No. 2007/0119377 discloses a barrier coating for vitreous apparatuses used in chemical vapor deposition (CVD) chambers, specifically thermocouples and supports in epitaxial reactors to minimize devitrification. The silicon nitride devitrification barrier coating is applied via CVD and is a maximum of 1 µm thick.

The barrier coating provided by embodiments of the present invention minimizes the erosion/corrosion of fused silica semiconductor processing apparatuses in the presence of hydrochloric acid and chloride processing gasses at temperatures in excess of 900° C. The barrier material was selected in such a manner that the slurry provides exceptional wetting characteristics, can be applied without employing complex CVD processes, and results in an erosion/corrosion barrier coating that has good adherence and a matched coefficient of thermal expansion (CTE) to the underlying fused silica material. Additionally, the erosion/corrosion barrier coating has a thickness greater than 1 µm, thermal conductivity that does not diminish response time of coated thermocouples and does not contaminate the process.

SUMMARY OF THE INVENTION

In one aspect, the present disclosure provides protective barrier coating for a substrate entailing (a) at least one corrosion-resilient metal; (b) at least one thixotropic matrix component; and (c) an inert solvent, where the barrier coating composition components (a)-(b) are present in a predefined ratio by weight of solids in the inert solvent (c), and where the barrier protection function of the coating is borne out of a thermochemical reaction coupling the components (a)-(c) to the substrate. In illustrative embodiments, the coating composition is devoid of alumina or aluminum compounds and alloys, and preferably other elements, particularly metals, that are regarded as contaminants in silicon chip processing. In some embodiments, the at least one corrosion-resilient metal are Tantalum (Ta) compounds selected from Tantalum carbide compounds ($TaC_x$), Tantalum boride ($TaB_2$), Tantalum hafnium carbide ($Ta_4HfC_5$), Tantalum nitride (TaN), Tantalum pentafluoride ($TaF_5$), Tantalum pentaiodide ($Ta_2I_{10}$), Tantalum pentoxide ($Ta_2O_5$), Tantalum telluride ($TaTe_2$), Tantalum(III) aluminide ($TaAl_3$), Tantalum(IV) sulfide ($TaS_2$), Tantalum(V) bromide ($Ta_2Br_{10}$), Tantalum(V) ethoxide ($Ta_2(OC_2H_5)_{10}$), Tantalum (V) chloride ($TaCl_5$), $TaO_2$, $TaCl_4$, and $Ta_3Al$, and combinations thereof.

In illustrative embodiments, the at least one corrosion-resilient metal is Tantalum(V) chloride ($TaCl_5$). In illustrative embodiments, the at least one thixotropic matrix component is composed of a silicate compound. In suitable embodiments, the silicate compound is fumed silica ($SiO_2$). In some embodiments, the inert solvent is ultra-pure water. In illustrative embodiments, the predefined ratio of components (a)-(b) is about 3:1 by weight. In illustrative embodiments, the predefined ratio of components (a)-(b) is about 75:25 by weight percentage, and wherein component (a) is Tantalum (V) chloride ($TaCl_5$) and component (b) is fumed silica. In illustrative embodiments, the weight by solids in the inert solvent is about 13% w/v, and wherein the inert solvent is ultra-pure water. In certain embodiments, the protective barrier coating further entails one or more filler materials, accelerants, hardening agents, hardening-accelerator agents, curing agents, surfactants, emulsifiers, reducing agents, fluidizing agents, rust-proofing agents, setting retarders, and inflating agents, and combinations thereof.

In some embodiments, the final coating composition possesses a closely matched coefficient of thermal expansion to the substrate. In illustrative embodiments, the thermochemical reaction is initiated in the presence of a heat source, open flame, furnace, and/or an oxygen-methane torch. In some embodiments, the thermochemical reaction occurs at a temperature of about from 500-1500° C. In illustrative embodiments, the substrate is selected from the group consisting of fused silica materials, silica wafers, metal alloy-doped silica, fused silica-based semiconductor components, fused silica plates, fused silica rods, fused silica solids and ingots, fused silica tubes, fused silica optical components, and semiconductor processing equipment, and combination thereof. In illustrative embodiments, the thickness of the coating on the substrate is about 2-50 μm. In suitable embodiments, the coating is multiple layers of coating on the substrate. In some embodiments, the substrate comprises a fused silica material.

In one aspect, the present technology relates to erosion-resilient semiconductor components having (a) a substrate comprising a fused silica material; and (b) a barrier coating composition entailing (i) at least refractory metal, (ii) at least one thixotropic matrix component; and (iii) an inert solvent, wherein the barrier coating composition components (i)-(ii) are present in a predefined ratio by weight of solids in the inert solvent (iii), and where the barrier protection function of the coating is borne out of a thermochemical reaction coupling the components (i)-(iii) to the substrate. In certain embodiments, the coating composition is devoid of alumina or aluminum compounds and alloys. In some embodiments, the at least one refractory metal is in the form of a Tantalum (Ta) compound selected from the group consisting of Tantalum carbide compounds ($TaC_x$), Tantalum boride ($TaB_2$), Tantalum hafnium carbide ($Ta_4HfC_5$), Tantalum nitride (TaN), Tantalum pentafluoride ($TaF_5$), Tantalum pentaiodide ($Ta_2I_{10}$), Tantalum pentoxide ($Ta_2O_5$), Tantalum telluride ($TaTe_2$), Tantalum(III) aluminide ($TaAl_3$), Tantalum(IV) sulfide ($TaS_2$), Tantalum(V) bromide ($Ta_2Br_{10}$), Tantalum(V) ethoxide ($Ta_2(OC_2H_5)_{10}$), Tantalum(V) chloride ($TaCl_5$), $TaO_2$, $TaCl_4$, and $Ta_3Al$, and combinations thereof.

In some illustrative embodiments, the erosion-resilient semiconductor component has at least one refractory metal is Tantalum (V) chloride ($TaCl_5$). In suitable embodiments, the at least one thixotropic matrix component is composed of a silicate compound. In illustrative embodiments, the silicate compound is fumed silica ($SiO_2$). In illustrative embodiments, the inert solvent is ultra-pure water. In illustrative embodiments, the predefined ratio of components (i)-(ii) is about 3:1 by weight. In illustrative embodiments, the predefined ratio of components (i)-(iii) is about 75:25 by weight percentage, and wherein component (i) is Tantalum (V) chloride ($TaCl_5$) and component (ii) is fumed silica. In illustrative embodiments, the weight by solids in the inert solvent is about 13% w/v, and wherein the inert solvent is ultra-pure water. In some embodiments, the erosion-resilient semiconductor component further has one or more filler materials, accelerants, hardening agents, hardening-accelerator agents, curing agents, surfactants, emulsifiers, reducing agents, fluidizing agents, rust-proofing agents, setting retarders, and inflating agents, and combinations thereof.

In some illustrative embodiments, the final coating composition possesses a closely matched coefficient of thermal expansion to the substrate comprising a fused silica material. In certain embodiments, the thermochemical reaction is initiated in the presence of a heat source, a furnace, open flame, and/or an oxygen-methane torch. In illustrative embodiments, the thermochemical reaction occurs at a temperature of about from 500-1500° C. In illustrative embodiments, the substrate comprising a fused silica material is selected from the group consisting of fused silica materials, silica wafers, metal alloy-doped silica, fused silica-based semiconductor components, fused silica plates, fused silica rods, fused silica solids and ingots, fused silica tubes, fused silica optical components, and semiconductor processing equipment, and combination thereof. In illustrative embodiments, the thickness of the coating on the substrate comprising fused silica is about 2-50 μm. In illustrative embodiments, the coating is multiple layers of coating on the substrate.

In one aspect, embodiments of the present invention is a erosion-resilient semiconductor substrate, where the substrate is a fused silica material having a surface treated with a surface composition composed of (i) at least refractory metal, (ii) at least one thixotropic matrix component; and (iii) an inert solvent, where the barrier coating composition components (i)-(ii) are present in a predefined ratio by weight of solids in the inert solvent (iii), and where the barrier protection function of the coating is borne out of a thermochemical reaction coupling the components (i)-(iii) to the substrate. In illustrative embodiments, the surface composition is devoid of alumina or aluminum compounds and alloys. In illustrative embodiments, the at least one refractory metal is in the form of a Tantalum (Ta) compound selected from the group consisting of Tantalum carbide compounds ($TaC_x$), Tantalum boride ($TaB_2$), Tantalum hafnium carbide ($Ta_4HfC_5$), Tantalum nitride (TaN), Tantalum pentafluoride ($TaF_5$), Tantalum pentaiodide ($Ta_2I_{10}$), Tantalum pentoxide ($Ta_2O_5$), Tantalum telluride ($TaTe_2$), Tantalum(III) aluminide ($TaAl_3$), Tantalum(IV) sulfide ($TaS_2$), Tantalum(V) bromide ($Ta_2Br_{10}$), Tantalum(V) ethoxide (Ta($OC_2H_5$)), Tantalum(V) chloride ($TaCl_5$), $TaO_2$, $TaCl_4$, and $Ta_3Al$, and combinations thereof.

In some illustrative embodiments, the at least one refractory metal is Tantalum(V) chloride ($TaCl_5$). In illustrative embodiments, the at least one thixotropic matrix component is composed of a silicate compound. In illustrative embodiments, the silicate compound is fumed silica ($SiO_2$). In illustrative embodiments, the inert solvent is ultra-pure water. In illustrative embodiments, the predefined ratio of components (i)-(ii) is about 3:1 by weight. In illustrative embodiments, the predefined ratio of components (i)-(iii) is about 75:25 by weight percentage, and where component (i) is Tantalum (V) chloride ($TaCl_5$) and component (ii) is fumed silica. In illustrative embodiments, the weight by solids in the inert solvent is about 13% w/v, and wherein the inert solvent is ultra-pure water.

In some embodiments the erosion-resilient barrier further entails one or more filler materials, accelerants, hardening agents, hardening-accelerator agents, curing agents, surfactants, emulsifiers, reducing agents, fluidizing agents, rust-proofing agents, setting retarders, and inflating agents, and combinations thereof. In illustrative embodiments, the final surface composition possesses a closely matched coefficient of thermal expansion to the substrate comprising a fused silica material. In illustrative embodiments, the thermochemical reaction is initiated in the presence of a heat source, open flame, a furnace, and/or an oxygen-methane torch. In illustrative embodiments, the thermochemical reaction occurs at a temperature of about from 500-1500° C. In illustrative embodiments, the substrate is a fused silica material of a thermocouple, spider, chamber surface or other piece of semiconductor processing equipment that is made of fused silica or has a fused silica surface. In some illustrative embodiments, the thickness of the surface composition is about 2-50 µm.

In one aspect, the present disclosure provides a method of preventing or decreasing the decomposition of a fused silica substrate by (a) mixing a slurry composition, with (i) at least one corrosion-resilient metal, (ii) at least one thixotropic matrix component, and (iii) an inert solvent, where the slurry composition components (i)-(ii) are present in a predefined ratio by weight of solids in the inert solvent (iii); (b) dipping the fused silica substrate in the slurry composition; and (c) heating the dipped-fused silica substrate. In illustrative embodiments, the slurry composition is mixed at a pH of ≤3, and more preferably ≤2. In illustrative embodiments, the dipped-fused silica substrate is resistant to decomposition from one or more of strong acids, HCl, temperatures up to 1500° C., and high velocity gas flows, and combinations thereof. In illustrative embodiments, the slurry composition is devoid of alumina or aluminum compounds and alloys In some embodiments, the at least one corrosion-resilient metal are Tantalum (Ta) compounds selected from the group consisting of Tantalum carbide compounds ($TaC_x$), Tantalum boride ($TaB_2$), Tantalum hafnium carbide ($Ta_4HfC_5$), Tantalum nitride (TaN), Tantalum pentafluoride ($TaF_5$), Tantalum pentaiodide ($Ta_2I_{10}$), Tantalum pentoxide ($Ta_2O_5$), Tantalum telluride ($TaTe_2$), Tantalum(III) aluminide ($TaAl_3$), Tantalum(IV) sulfide ($TaS_2$), Tantalum(V) bromide ($Ta_2Br_{10}$), Tantalum(V) ethoxide ($Ta_2(OC_2H_5)_{10}$), Tantalum (V) chloride ($TaCl_5$), $TaO_2$, $TaCl_4$, and $Ta_3Al$, and combinations thereof. In illustrative embodiments, the at least one corrosion-resilient metal is Tantalum(V) chloride ($TaCl_5$). In illustrative embodiments, the at least one thixotropic matrix component is composed of a silicate compound. In illustrative embodiments, the silicate compound is fumed silica ($SiO_2$). In illustrative embodiments, the inert solvent is ultra-pure water. In illustrative embodiments, the predefined ratio of components (i)-(iii) is about 3:1 by weight. In illustrative embodiments, the predefined ratio of components (i)-(ii) is about 75:25 by weight percentage, and wherein component (i) is Tantalum(V) chloride ($TaCl_5$) and component (ii) is fumed silica. In illustrative embodiments, the weight by solids in the inert solvent is about 13% w/v, and wherein the inert solvent is ultra-pure water.

In some embodiments, the methods further entail adding one or more materials to the slurry composition selected from the group consisting of filler materials, accelerants, hardening agents, hardening-accelerator agents, curing agents, surfactants, emulsifiers, reducing agents, fluidizing agents, rust-proofing agents, setting retarders, and inflating agents, and combinations thereof. In illustrative embodiments, the dipping step comprises submerging the entire fused silica substrate into the slurry composition. In illustrative embodiments, the dipping step comprises submerging less than the entire fused silica substrate into the slurry composition. In illustrative embodiments, the dipping step comprises submerging the entire fused silica substrate or less than the entire substrate into the slurry composition multiple times.

In some illustrative embodiments, the dipping step further comprises a removal step having a predefined withdrawal rate. In illustrative embodiments, the withdrawal rate is from 0.5 inches of the fused silica substrate to 5 inches of the fused silica substrate per minute. In illustrative embodiments, the heating step comprises initiating a thermochemical reaction in the presence of a heat source, a furnace, open flame, and/or an oxygen-methane torch. In illustrative embodiments, the thermochemical reaction occurs at a temperature of about from 500-1500° C. In illustrative embodiments, the thermochemical reaction is sufficient to form covalent bonds in the slurry compositions and to the fused silica substrate such that no flaking or participation occurs. In illustrative embodiments, the fused silica substrate is selected from the group consisting of pure fused silica materials, silica wafers, metal alloy-doped silica, fused silica-based semiconductor components, fused silica plates, fused silica rods, fused silica solids and ingots, fused silica tubes, fused silica optical components, and semiconductor processing equipment, and combination thereof. In illustrative embodiments, the thickness of the slurry composition on the fused silica substrate is about 2-50 µm. In illustrative embodiments, multiple layers of the slurry composition are formed on the substrate. In illustrative embodiments, steps (a)-(c) are repeated one or more times.

The foregoing summary is illustrative only and is not intended to be in any way limiting. In addition to the illustrative aspects, embodiments, and features described above, further aspects, embodiments, and features will become apparent by reference to the following drawings and the detailed description.

DETAILED DESCRIPTION

Figure 1:
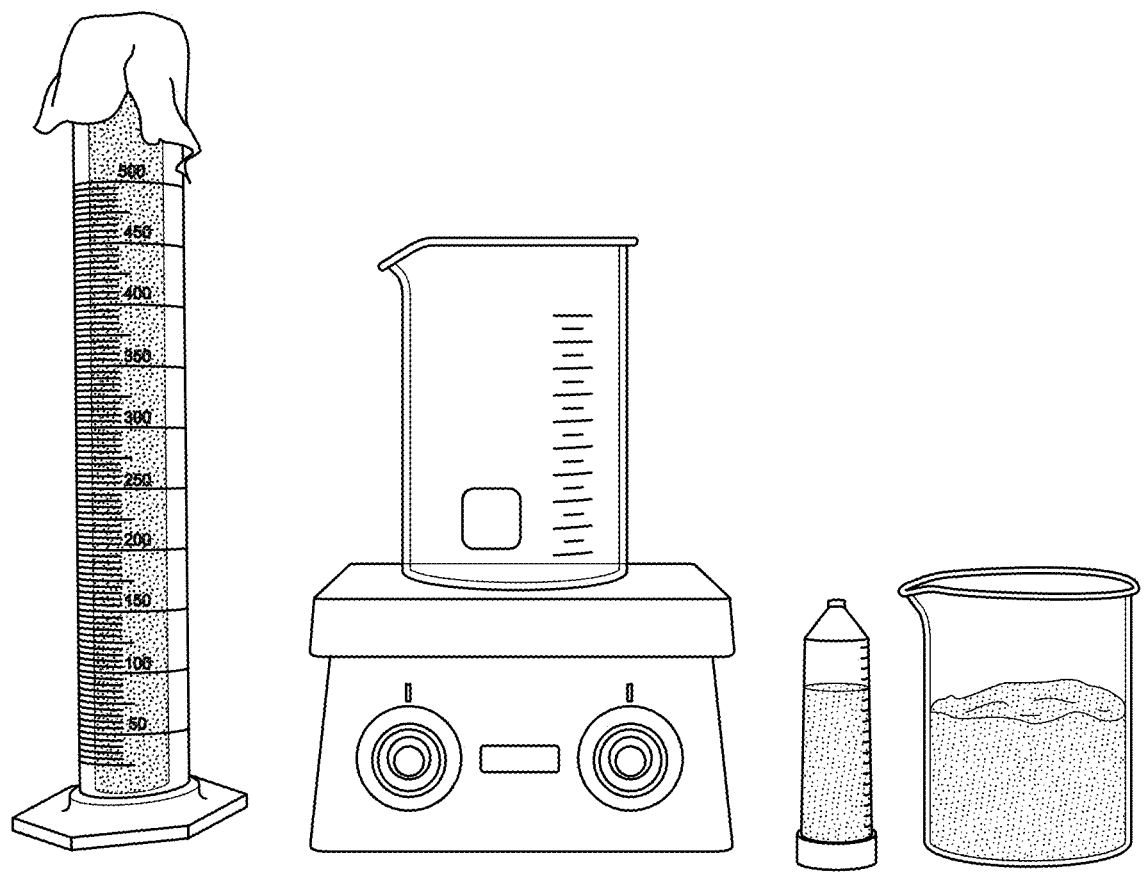
FIG. 1 shows an example of the slurry preparation set up including a stir plate, beaker, and magnetic stir bar, all of which are positioned under fume hood (not shown).

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The definitions of certain terms as used in this specification are provided below. Unless defined otherwise, all technical and scientific terms used herein generally have the same meaning as commonly understood by one of ordinary skill in the art to which this invention belongs. As used herein, unless otherwise stated, the singular forms "a," "an," and "the" include plural reference.

As used herein, the term "about" will be understood by persons of ordinary skill in the art and will vary to some extent depending upon the context in which it is used. If there are uses of the term which are not clear to persons of ordinary skill in the art, given the context in which it is used, the term "about" in reference to quantitative values will mean up to plus or minus 10% of the enumerated value.

As used herein, the term "composition" refers to a product with specified ingredients in the specified amounts, as well as any product which results, directly or indirectly, from combination of the specified ingredients in the specified amounts.

As used herein, the term "coefficient of thermal expansion" or "CTE" describes how the size of an object changes with a change in temperature. Specifically, it measures the fractional change in size per degree change in temperature at a constant pressure. Several types of coefficients have been developed: volumetric, area, and linear. In this respect, compositions with relatively low coefficients of thermal expansion are beneficial insofar as the compatibility with other semiconductor components. The low CTE also means that components containing the compounds and compositions of the present invention can be used over a wide temperature range without causing a failure due to internal expansion stress, in illustrative embodiments.

As used herein, the phrases "coating", "barrier coating", "protective barrier" and/or "dip coating", refer to liquid, semi-solids and viscous modalities of a compound or mixture made from its component parts, and include, but are not limited to Tantalum (Ta) compounds selected from Tantalum carbide compounds ($TaC_x$), Tantalum boride ($TaB_2$), Tantalum hafnium carbide ($Ta_4HfC_5$), Tantalum nitride (TaN), Tantalum pentafluoride ($TaF_5$), Tantalum pentaiodide ($Ta_2I_{10}$), Tantalum pentoxide ($Ta_2O_5$), Tantalum telluride ($TaTe_2$), Tantalum(III) aluminide ($TaAl_3$), Tantalum(IV) sulfide ($TaS_2$), Tantalum(V) bromide ($Ta_2Br_{10}$), Tantalum(V) ethoxide ($Ta_2(OC_2H_5)_{10}$), Tantalum(V) chloride ($TaCl_5$), $TaO_2$, $TaCl_4$, $Ta_3Al$, silicate compounds, silicate compounds composed of fumed silica ($SiO_2$), ultra-pure water, where a predefined ratio of components is employed in some embodiments, where the weight percentage is about 75:25 by weight.

As used herein, the term "glass transition temperature" or "Tg" is a property of a material or composition in which the temperature region of a component transitions from a hard, glassy material to a soft, rubbery material. The high glass transition temperatures characteristic of certain compositions are well suited for use in the semiconductor industry.

"Inert" is used herein as meaning not manifesting significant chemical reactivity.

As used herein, the term "matched" refers to a relative comparison of intrinsic properties, where, in illustrative embodiments, the "matching" represents nearly identical values.

As used herein, the term "wettability" or "wetting" refers to the ability of a substance to maintain surface contact with a different substance or surface. Surface contact results from intermolecular interactions between a substance and the contacted surface.

Overview

In one aspect, the present technology relates to materials and methods for preparing and using a "Tantalum Dip-Coating" that is applied to a sheath composed of fused silica In brief, certain embodiments of the present technology entail a composition of Tantalum (V) chloride ($TaCl_5$), fumed silica ($SiO_2$) at 300-350 $m^2/g$ and ultra-pure water, where the $SiO_2$ is first added in the water followed by a gradual addition of the $TaCl_5$, which is then stirred. In this particular embodiment, the resulting slurry is poured into the dip-coating container and a desired region of the fused silica sheath is subsequently submerged into the slurry via a dip-coater or appropriate, e.g., Instron apparatus (dipping step), in illustrative embodiments. At a withdrawal rate of, for example only, 0.0762 cm/s, the coated fused silica sheath is removed from the slurry and allowed to air dry before subjecting the coated region to a heat source from an oxygen/methane torch or furnace, for example, in the firing step, in suitable embodiments. The coated fused silica sheath is then allowed to cool and additional coatings may be added by repeating the dipping and firing steps in various embodiments.

In some illustrative embodiments, the present disclosure entails a coating composition for use on certain components of industrial devices and systems, and methods relating to the same. In short, a tantalum oxide coating is applied to a fused silica substrate, in suitable embodiments, to extend the life of the fused silica when exposed to harsh/abrasive environments, e.g., high temperatures ($\leq 1250°$ C.), erosive and/or or corrosive materials or substances such as, for example, hydrogen chloride, etc. When used in the semiconductor industry, the resulting fused silica-coated with a tantalum oxide-rich composition—is the interior surface of a reaction chamber or positioned inside along with one or more wafers being processed. It is important to note that the coating will not contaminate the wafers or process chamber.

Various embodiments and applications of the coating are envisaged within the purview of the semiconductor industry, as noted herein, and certain embodiments relate to the process of making the instant coating and applying it to a substrate, e.g., fused silica components, fused silica chamber walls, and/or other related components housed within a reaction chamber. The coating comprises, among other elements, a combination of ultra-pure water, fumed silica and tantalum chloride, which, when combined under appropriate conditions and at various concentrations, form a slurry that the substrate, e.g., fused silica, components can be subsequently submerged in, at least once, for various time periods. Once coated with the slurry, the coated substrate is heated, e.g., by open flame, furnace, etc., to initiate a reaction that bonds the coating and the substrate. Subsequent layers of the coating may be added to increase the effectiveness, e.g., protection of the substrate from erosion/corrosion. The entire system is, in essence, an industrial scale coating process that can be applied to fused silica substrates comprising a semiconductor reaction chamber, although myriad applications exist.

Compositions and Uses Thereof

The present disclosure, in illustrative embodiments, entails coatings or protective barrier coatings for a substrate entailing (a) at least one corrosion-resilient metal; (b) at least one thixotropic matrix component; and (c) an inert solvent, where the barrier coating composition components (a)-(b) are present in a predefined ratio by weight of solids in the inert solvent (c), and where the barrier protection function of the coating is borne out of a thermochemical reaction coupling the components (a)-(c) to the substrate. In illustrative embodiments, the coating composition is devoid of alumina or aluminum compounds and alloys. In some embodiments, the at least one corrosion-resilient metal are Tantalum (Ta) compounds selected from Tantalum carbide compounds ($TaC_x$), Tantalum boride ($TaB_2$), Tantalum hafnium carbide ($Ta_4HfC_5$), Tantalum nitride (TaN), Tantalum pentafluoride ($TaF_5$), Tantalum pentaiodide ($Ta_2I_{10}$), Tantalum pentoxide ($Ta_2O_5$), Tantalum telluride ($TaTe_2$), Tantalum(III) aluminide ($TaAl_3$), Tantalum(IV) sulfide ($TaS_2$), Tantalum(V) bromide ($Ta_2Br_{10}$), Tantalum(V) ethoxide ($Ta_2(OC_2H_5)_{10}$), Tantalum(V) chloride ($TaCl_5$), $TaO_2$, $TaCl_4$, and $Ta_3Al$, and combinations thereof.

More specifically, the methods and compositions of the present disclosure are employed for use on certain components of industrial devices and systems. In short, various aspects of the present disclosure comprise a tantalum oxide coating onto a fused silica substrate to extend the life of the fused silica when exposed to harsh/abrasive environments, e.g., high temperatures (≤1250° C.), erosive and/or corrosive materials or substances such as, for example, hydrogen chloride, etc. When used in the semiconductor industry, the resulting fused silica-coated with a tantalum oxide-rich composition—is the interior surface of a reaction chamber or positioned inside a reaction chamber along with one or more wafers being processed, in some embodiments. It is important to note that the coating will not contaminate the wafers or process chamber.

Various embodiments and applications of the coating are envisaged within the purview of the semiconductor industry, as noted above, but the present technology is not so limited. One specific embodiment of the present technology relates to the process of making the instant coating and applying it to a substrate, e.g., fused silica components, fused silica chamber walls, and/or other related components housed within a reaction chamber. The coating comprises, among other elements, a combination of ultra-pure water, fumed silica and tantalum chloride, which, when combined under appropriate conditions and at various concentrations, form a slurry that the substrate, e.g., fused silica, components can be subsequently submerged in, at least once, for various time periods, in various embodiments. Once coated with the slurry, the coated substrate is heated, e.g., by open flame, furnace, etc., to initiate a reaction that bonds the coating and the substrate, in illustrative embodiments. Subsequent layers of the coating may be added to increase the effectiveness, e.g., protection of the substrate from corrosion, erosion, in illustrative embodiments. The entire system is, in one aspect, an industrial scale coating process that can be applied to fused silica substrates, thermocouples, and other components that would benefit from a barrier coating, within a semiconductor reaction chamber, in certain embodiments.

Along these lines, the present invention provides a composition that is ideally suited for a variety of applications, including, in illustrative embodiments, semiconductor applications. The present invention provides a composition, slurry, coating, barrier and the like, that has the desired glass transition temperature and coefficient of thermal expansion that makes it suitable for semiconductor processing or thermocouple application, among other applications.

To protect the thermocouples from the high temperatures and acidic environment that is typically found in a reaction chamber, the sheath or substrate is typically made of fused silica or other vitreous materials. In illustrative embodiments, the substrate comprising a fused silica material is selected from the group consisting of fused silica materials, silica wafers, metal alloy-doped silica, fused silica-based semiconductor components, fused silica plates, fused silica rods, fused silica solids and ingots, fused silica tubes, fused silica optical components, and semiconductor processing equipment, and combination thereof.

By way of example only, thermocouple (TC) substrates of the present technology, typically comprise a sheath circumferentially surrounding a support component. TC leads, wiring and electrical components may extend through such a support to form a junction that may be located at the proximal end of the thermocouple in some embodiments. Other embodiments provide for different junction location. In such arrangements, an additional junction can be located adjacent the rear or downstream corners, e.g., between the upstream and downstream corners. The present technology, in this regard, focuses on the preservation of TC's and various semiconductor components. To this end, protecting the TC's from corrosive, high temperature, and acidic environments-typically found in the reaction chamber—a cover or sheath may be composed of fused silica or other silicate and/or vitreous materials in suitable embodiments. As described in detail above, such fused silica sheaths are useful in protecting the thermocouple during wafer processing.

To prevent such a barrier coating is formed over the sheath of the TC, which imparts a barrier between the fused silica substrate or sheath and the corrosive environments of the TC chamber. In illustrative embodiments, the barrier coating is thin, does not contain significant mass, possesses thermal conductivity, and does not significantly alter the surface emissivity of the substrate. The barrier coating material is resistant or resilient with respect to environments of low pH, high temperatures, and/or thermal cycling in some embodiments. Such a material possesses characteristics including, but not limited to, the ability to be applied via simple, straight-forward means, such as dipping or brush-on application, as well as, molecular deposition, excellent adherence to the underlying substrate, resistance to spalling or flaking, non-insulating, chemically stable and compatible with the environments and materials used in processing and cleaning, and not a source of metals or other contaminants.

In this regard, the use of tantalum oxide coatings on fused silica substrates relates to one aspect of the present invention. Such applications, in certain embodiments of the present invention, extend the life of the fused silica when used in high temperature (up to 1250° C.) and erosive or corrosive (hydrogen chloride, etc.) environments. When used in the semiconductor industry and this coated fused silica is inside the reaction chamber along with the wafer(s) being processed, this coating will not contaminate the wafer (s) or process chamber. One embodiment of this coating may be made using ultra-pure water, fumed silica and tantalum chloride to form a slurry that fused silica components may be dipped in. Once coated with the slurry, the coating may be heated by torch or furnace and subsequent layers of coating may be added to increase the effectiveness of the coating.

Refractory metals, such as Tantalum (Ta), are used in high-temperature (≥900° C.) energy conversion applications due to their high melting temperature, low vapor pressure, and low infrared emissivity. Tantalum metal in this regard is a very corrosion resistant material. It is almost completely immune to attack by acids and liquid metals. Only a few chemical reagents like hydrofluoric acid, fuming sulfuric acid (oleum), and strong alkalis have a tendency to weakly attack tantalum. The reason for the high stability is that tantalum forms an extremely stable oxide layer on its surface, when exposed to oxygen in the atmosphere.

The above-mentioned barrier coating compositions, in some embodiments, possess a thickness, when coated on a substrate, from about 1 µm to about 100 µm, and more preferably from about 2 µm to about 50 µm.

The respective compositions and/or layers preferably have a uniform thickness in some embodiments. In addition, the respective compositions layers may be formed of the same materials. In suitable embodiments, it is preferred that the respective compositions and/or slurry layers be formed of the same material with the same thickness. In such configuration, a heat stress is uniformly applied on both surfaces of the substrate even in the case of carrying out heat treatment, and hence warping and waviness are very hard to occur.

Certain embodiments of the present invention include methods of applying the coatings by using a slurry or suspension of the desired oxides, or compounds thermally decomposable to the desired oxides, in water. The steps of the method entail, in some embodiments, preparing an aqueous suspension consisting essentially of a coating component and a water component, wherein the coating component consists essentially of compounds which, upon firing, will yield, acceptable results. While in many cases the oxides themselves will comprise the coating component of the suspension, and thus, the evaporation product layer, other compounds may be substituted which will yield the required oxides in the desired proportions upon firing the evaporation product layer. Thus, the present technology employs, in some embodiments, Tantalum (Ta) compounds selected from Tantalum carbide compounds ($TaC_x$), Tantalum boride ($TaB_2$), Tantalum hafnium carbide ($Ta_4HfC_5$), Tantalum nitride (TaN), Tantalum pentafluoride ($TaF_5$), Tantalum pentaiodide ($Ta_2I_{10}$), Tantalum pentoxide ($Ta_2O_5$), Tantalum telluride ($TaTe_2$), Tantalum(III) aluminide ($TaAl_3$), Tantalum(IV) sulfide ($TaS_2$), Tantalum(V) bromide ($Ta_2Br_{10}$), Tantalum(V) ethoxide ($Ta_2(OC_2H_5)_{10}$), Tantalum (V) chloride ($TaCl_5$), $TaO_2$, $TaC_4$, and $Ta_3Al$, and combinations thereof. The foregoing selections are, in part, due to the ability of the selected components to readily dissolve and react with the substrate.

Insoluble solids used in making up the slurry, such as Si, should have a particle size small enough to be both readily mixed and reasonably stable in suspension. Of course, volatile solvents other than water may be used to form the suspension, if desired. Preferably, the pH of the slurries prepared as described will range between about 0.01 and 3, in some embodiments. One of the preferred methods for applying the slurries to the glass or fused silica articles or substrates to be protected comprises dipping the glass into the slurries. In applying the slurry, care must be taken not to obtain an excessively thick coating due to a potential thermal expansion difference between the coating of the invention and the high silica base glasses to which they will normally be applied.

After applying the barrier coating slurries to the substrate, the moisture should be removed from the coating prior to firing or heating in some embodiments. The drying process may be accelerated by heating, for example, in an oven, under a heat lamp, or with a flame, if desired. However, excessively rapid heating should be avoided because it may cause peeling and crazing of the coating. Following drying, the coating is fired to a temperature sufficient to cause the fusion and interaction thereof with the substrate. This can conveniently be accomplished with the air of a natural gas-oxygen/methane flame or furnace without the need for heating the entire article to the temperature at which the coating will fuse to the substrate. Hence, sufficient heating to cause reaction of the coating with the substrate can be obtained simply by directing a gas-oxygen/methane flame onto the area of the coating to be reacted for a period of several seconds.

While Ta-compositions are employed as the base component in suitable embodiments of the present disclosure, substantially similar compounds and/or compositions may be used in certain embodiments, such as, e.g., related molecules, compounds and compositions possessing a similar or identical functional profile or are coterminous to the compositions at least one corrosion-resilient metal and/or the at least one thixotropic matrix component with respect to their properties, characteristics or parameters, which allow for a similar or identical matrix to precipitate are acceptable in suitable embodiments. Likewise, the present disclosure contemplates one or more structures, conjugates, compounds, compositions and the like, consistent with the steric profile, conformation, structural and/or empirical formulations, stoichiometric ratios, spectrophotometric profiles, NMR profiles, refractive indices, liquid transition temperatures, and/or CTE ranges, and/or other data profiles consistent with the present compositions and tautomers, diastereomers, enantiomers, isomers or stereoisomers of the compounds and compositions of the present invention.

In illustrative embodiments, the above-mentioned compositions and layers may further contain any appropriate additive depending on purposes and efficacy of the additive to the overall technology functionality. Examples of the above-mentioned additive include, but are not limited to, a diluent, an antioxidant, a denaturant, a surfactant, a dye, a pigment, a discoloration inhibitor, a UV absorber, a softener, a stabilizer, a plasticizer, an antifoaming agent, and/or a reinforcing agent, but only in certain specific embodiments. The kind, number, and amount of additives contained in a composition may be appropriately set depending on purposes.

The embodiments of the present invention may also contain a filler dispersed in the coating so that compound has physical properties that are compatible with various semiconductor processes used in the industry. A filler is typically a non-reactive component of the compound, mixture or coating, which may or may not alter certain properties of the coating, e.g., physical properties such as, but not limited to, polymerization shrinkage and coefficient of thermal expansion, and the like. However, great care must be taken to select an appropriate filler, if used at all, that remain inert or provides the coating with the desired physical properties and that meets the requirements for a given application.

Particulate materials can also be used in accordance with various embodiments of the compositions of the invention disclosed herein, and, in specific embodiments, include all materials containing a high proportion of silica, such as siliceous sand; refractory materials; granular metal oxides such as zirconium oxides; and abrasive products such as carborundum, emery, quartz, garnet, silicon carbide, etc. Other materials may be included in the compositions of the invention to provide additional desirable results. For example, coupling agents such as silanes and titanates can be included for improving the bond between the particulate materials and to improve the ability of the composite to retain its original properties after prolonged heating, aging and/or exposure to moisture.

Nevertheless, the protective barrier coatings disclosed herein relate to coatings for substrates that entail (a) at least one corrosion-resilient metal; (b) at least one thixotropic matrix component; and (c) an inert solvent, where the barrier coating composition components (a)-(b) are present in a predefined ratio by weight of solids in the inert solvent (c), and where the barrier protection function of the coating is borne out of a thermochemical reaction coupling the components (a)-(c) to the substrate. In illustrative embodiments, the coating composition is devoid of alumina or aluminum compounds and alloys. In some embodiments, the at least one corrosion-resilient metal are Tantalum (Ta) compounds selected from Tantalum carbide compounds ($TaC_x$), Tantalum boride ($TaB_2$), Tantalum hafnium carbide ($Ta_4HfC_5$), Tantalum nitride (TaN), Tantalum pentafluoride ($TaF_5$), Tantalum pentaiodide ($Ta_2I_{10}$), Tantalum pentoxide ($Ta_2O_5$), Tantalum telluride ($TaTe_2$), Tantalum(III) aluminide ($TaAl_3$), Tantalum(IV) sulfide ($TaS_2$), Tantalum(V) bromide ($Ta_2Br_{10}$), Tantalum(V) ethoxide ($Ta_2(OC_2H_5)_{10}$), Tantalum (V) chloride ($TaCl_5$), $TaO_2$, $TaCl_4$, and $Ta_3Al$, and combinations thereof.

Such compositions of the present disclosure can cover a substrate wholly, partially, circumferentially, or in any suitable manner as needed, with the barrier coating so as to protect the semiconductor components as described above. As such, it should be appreciated that a barrier coating can be provided wherever fused silica is found, for example, in the chamber, so long as the barrier layer does not substantially interfere with the operation of the chamber. Other reactor components that may comprise fused silica, and which may therefore benefit from a protective barrier layer, include support pieces, pins, ledges, projections, etc. typically found within a chamber and used to support other reactor components. In addition to fused silica, any amorphous material that is subject to erosion/corrosion may be protected with a barrier layer.

One of the beneficial results of the foregoing techniques concerns an increase in the lifetime of the fused silica components, when protected with barrier layers, may be significantly extended. Specifically, the life of fused silica thermocouple sheaths, protected with a barrier later, have been increased by approximately 3-fold. In some embodiments, however, the life of the coated component is extended by 4-, 5-, 6-, 7-, 8-, 9-, 10-, 15-, 20-, 30-, 40, 50-, or 100-fold. Moreover, increasing the lifetime of fused silica components obviously results in lower consumable costs. Likewise, extending the intervals between reactor preventive maintenance result in less down time and less reactor tuning. Less reactor tuning also results in lower use of monitor wafers. Thus, it can be seen that the use of barrier coatings to protect components comprising fused silica, or other vitreous materials, in the reactor can provide very significant benefits. Let it be noted that while the invention has been described in connection with a particular type of component, the invention can also be applied to other types of components, reactions chambers and the like.

Of the materials used in accord with the semiconductor industry, most suffer from limitations relating to (i) a coefficient of thermal expansion (CTE) that causes a device to be damaged as the device undergoes wide temperature variations, (ii) a glass transition temperature (Tg) that causes the compound to become soft and rubbery under conventional assembly process conditions, and (iii) are susceptible to breakdown in a variety of corrosive environments. The present invention in this regard provides a coating that has desired chemical and physical properties to function for its intended use, which consequently imparts a composition suitable for semiconductor component protection and application. In some embodiments, the barrier coating has a coefficient of thermal expansion of less than 30 parts per million/degree Celsius (PPM/° C.), a glass transition temperature in excess of 130° C., and a suitable resilience to breakdown when subjected to corrosive environments.

EXAMPLES

The present compositions and methods will be understood more readily by reference to the following examples, which are provided by way of illustration and are not intended to be limiting in any way.

Example 1—Materials/Methods for Preparing a Tantalum Dip Coating (A Procedure)

Slurry Raw Materials:

Tantalum(V) chloride ($TaCl_5$), Silicon(IV) oxide and ultrapure water. Regarding the slurry preparation materials and equipment used in the present examples, a glove-box, borosilicate beakers (size depends on size of batch), PTFE magnetic stir bars, a Corning stir plate, a scale, polystyrene weight boats, spatula, goggles, and surgical mask are typically employed in accord with the present invention. Likewise, the materials and equipment specifically relating to the dip-coating process include, but are not limited to, an apparatus for stabilizing samples during the dip-coating process, polypropylene/polystyrene/ABS slurry containers, a dip-coater (Instron), an oxygen/methane torch, ignition source, foil paper, tools for measuring and marking the various components, Fisher 70% isopropyl alcohol, and Kim wipes.

Weighing of Raw Materials:

because Tantalum(V) chloride, Puratronic, 99.99% metals basis (CAS#7721-01-9) from Alpha Aesar is hygroscopic, and to ensure reactivity of Ta—and maintain reactivity of surplus Ta—when added to the initial slurry preparation, the Ta was measured in a glove box (dry air) and placed in a Falcon polypropylene conical centrifuge tube and sealed to transfer from glove box to fume hood. An identical Falcon tube was also employed for storing the surplus Ta in the glove box, in illustrative embodiments.

Silica:

Silicon(IV) oxide, amorphous fumed, S.A. 300-410 $m^2/g$ (CAS#7631-86-9) from Alpha Aesar is an extremely light material and easily disperses into the air during movement. As such, prior to weighing the fumed silica, goggles and surgical masks were used by lab personnel to protect against inhalation. The silica was weighed onto a large weigh boat or into a beaker using a large spatula, covered, and transferred to the fume hood.

Ultrapure Water:

the ultrapure water was obtained from a Millipore Milli-Q water filtration system and measured using either a graduated cylinder or pipette and left in the graduated cylinder, or pipetted into the mixing beaker. The container holding ultrapure water was covered and placed under fume hood, in illustrative embodiments.

Slurry Preparation as a Continuous Process:

the dip-coating and firing lab space were prepared prior to weighing the raw materials for the slurry, which was prepared under a fume hood inasmuch as $TaCl_5$ reacts with $H_2O$ to form HCl gas. In short, the stir plate, beaker, and magnetic stir bar were positioned under fume hood, and the magnetic stir bar was positioned in the appropriate beaker for stirring. Here, the water from the graduated cylinder was added to the beaker and stirred at moderate speed. The silica was subsequently added in a gradual manner to the stirring water. As viscosity of the mixture increased, the speed of stirring was accordingly increased. Following silica addition, a thick, opaque mixture was obtained, and the $TaCl_5$ was gradually add to the stirring mixture. Thereafter, the mixture was stirred for 5 minutes and the sheath/substrate was prepared for dip-coating.

Dip-Coating Apparatus:

An apparatus or dip-coating machine suitable for the present manual applications of the present technology and capable of withdrawing a substrate vertically from a slurry at a controlled speed (Instron 5566 Universal Testing Machine w/1 kN load cell). Such equipment was employed insofar as the withdrawal rate of the substrate from the dip-coating, i.e., the barrier coating, must be performed in a controlled manner, in illustrative embodiments. When the Instron was employed, it was prepared to allow for insertion/removal of fused silica sheaths, while still exhibiting the ability to hold fused silica sheaths steady throughout dip-coating process, in illustrative embodiments. Here, the Instron (dip-coater) was set to a withdrawal rate of 0.0762 cm/s (45.72 mm/min; 1.8 in/min). The sample-holding apparatus was thereafter inserted into the Instron/dip-coater and the container for holding slurry during dip-coating at station was placed thereunder. Prior to empirical use, a fused silica sheath was positioned in the apparatus and place container under the sheath to ensure clearance. The fused silica sheath was labeled at the end of the desired coating length and subsequently plunged into the container to ensure that the container possessed a volume sufficient to house the substrate without the sheath hitting the bottom.

Dip-Coating:

isopropyl alcohol and Kim wipes were first used to clean the fused silica sheath/substrate. The fused silica sheath was subsequently inserted into the sample-holding apparatus, while ensuring that the sheath was raised high enough so that the slurry-holding container could be immediately placed underneath. After the Instron/dip-coating machine was set to a withdrawal rate of 0.0762 cm/s, the slurry was transferred to the dip-coating container. The fused silica sheath was accordingly plunged into the container to the desired location and subsequently withdrawn from the slurry. After withdrawal, the coated fused silica sheath was allowed to air dry for 2 minutes. At that time the slurry was poured back into the beaker with the stir bar, and place back on top of stir plate and continue stirring. The dry-coated fused silica sheath was subsequently removed from the sample-holding apparatus and prepared for firing. During this step, the torch was used to fire the barrier coating and ensure its adherence to the fused silica sheath. As such, a tabletop torch was employed, where both gas tank (oxygen and methane) valves were opened for ignition of the flame.

Firing:

during this final step, the coated sheath was placed on foil paper, where only the uncoated section was contacted, and the torch was ignited. The fused silica sheath was positioned such that the coated section of the sheath was laterally moved through the flame, while also being rotated such that each section of the coating came into contact with the flame (10 see). A lathe can be employed, or this step can be performed manually. After the coating was fired, the torch was turned off, and the fused silica sheath was allowed to cool to room temperature; after cooling, a Kim wipe (without isopropyl alcohol) was used to wipe the coated section to ensure removal of any loose particulates. Various additional applications of coating layers, were added in other embodiments by repeating the dip coating and firing steps as noted above, where firing was not always sequential to dip-coating.

Example 2—Materials/Methods for Preparing a Tantalum Dip Coating (C Procedures)

Reagents, Materials and Equipment:

The solids slurry components: Tantalum(V) chloride, Puratronic, 99.99% Metals basis (CAS #7721-01-9) and Silicon (IV) Oxide, amorphous fumed, S.A. 300-350 $m^2/g$ (CAS #7631-86-9) were obtained from Alpha Aesar. The Ultrapure water used as a solvent was filtered by reverse osmosis, measured into a borosilicate graduated cylinder, covered with foil paper and chilled overnight in a refrigerator. Regarding general slurry preparation materials and equipment used in the present examples, a scale capable of measuring thousandths of a gram, polystyrene weigh boats, spatulas, surgical masks, protective eyewear, borosilicate glass beakers, plastic wrap, rubber bands, PTFE magnetic stir bars, a Cole Parmer stir plate, are typically employed in the present invention. Likewise, the materials and equipment specifically relating to the dip coating and firing processes include, but are not limited to, PROSAT 850 70/30 Isopropyl Alcohol wipes, tools to measure and mark the various components, fixtures for dipping, drying and firing, a dip coating apparatus, an oxygen/methane torch, and a 1600° C. furnace.

Slurry Preparation:

For a continuous coating process the materials were collected, apparatuses set-up and the raw materials weighed out prior to slurry mixing. Consideration was taken for weighing the hydroscopic $TaCl_5$ to ensure the smallest window of exposure where the slurry is batched according to weights that can be obtained from Alpha Aesar ampoules under argon (such as 5 g, 25 g, 100 g). Each ampoule was then opened, as needed, immediately prior to adding to the slurry. Slurry was prepared in a fume hood to draw away harmful HCl gas generated when the $TaCl_5$ is added to and reacts with water. Therefore, the Cole Parmer stir plate, beaker and stir bar were all placed under the fume hood (FIG. 1). The chilled water was then transferred from the graduated cylinder into the beaker and set to stir where a slight vortex was obtained. The fumed silica was then gradually added ensuring clumps did not start forming on the surface or within the volume of the slurry. The addition of fumed silica increases the slurry viscosity therefore stir speed was monitored and adjusted accordingly. After all the fumed silica had been added the slurry was stirred for 5 mins to ensure even particle dispersal. After this period of time the first required TaCl$_5$ ampoule was opened and very gradually added to the slurry. Once all the TaCl$_5$ had been added, the slurry was mixed for 5 mins, after 5 mins it was then checked for any agglomerations within the volume of the slurry or at the edges of the beaker. The slurry was left stirring while preparing the substrate for dip coating or covered and stirred for up to 3 days.

Substrate Preparation:

PROSAT cleaning wipes were used to clean the fused silica surface to be coated and all surfaces that would contact the fused silica such as the dipping, drying and firing fixtures. Additionally, each tubewell was labeled with mitty markers to maintain traceability.

Figure 2:
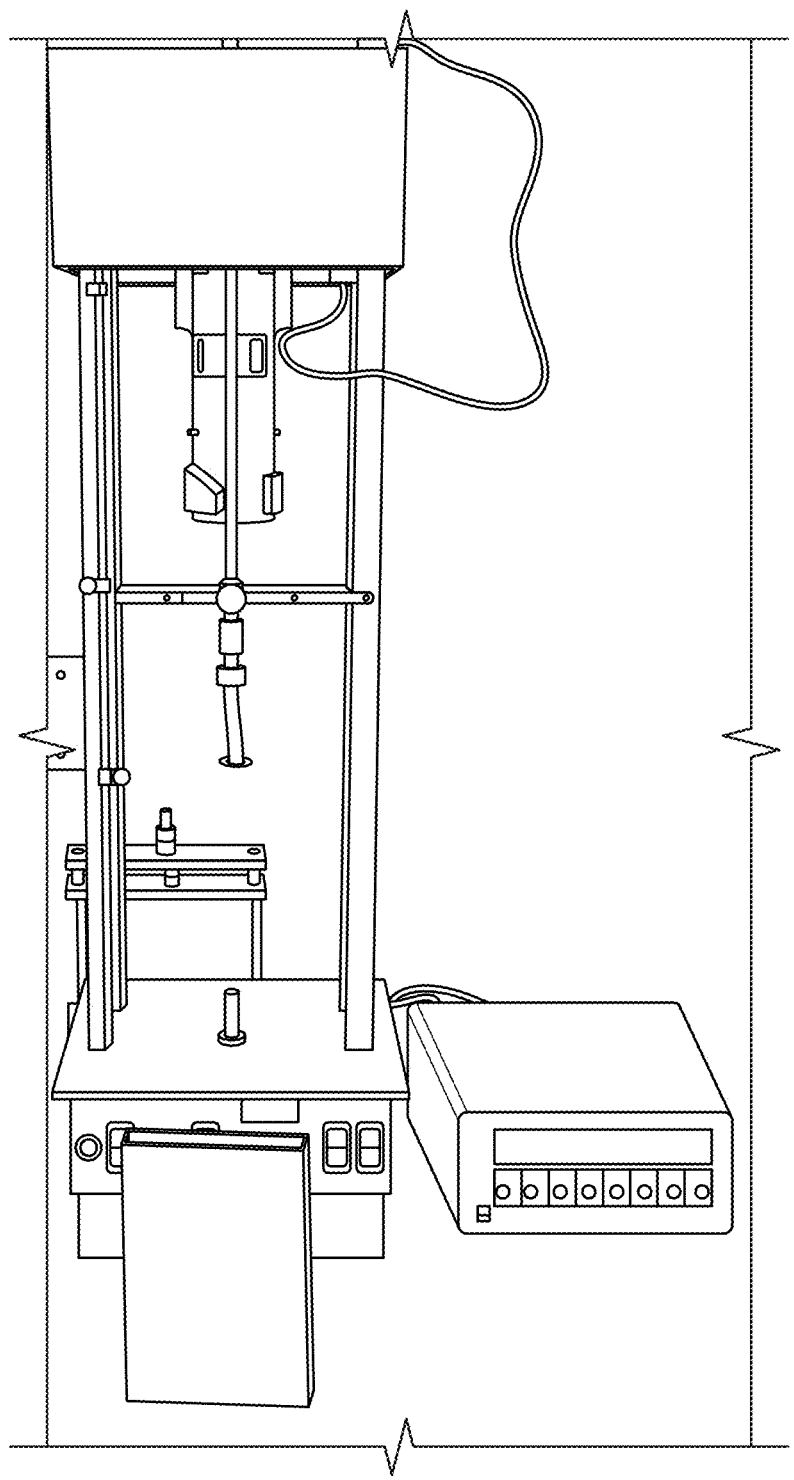
FIG. 2 shows an example of a dip coating apparatus (Instron dip coating machine).

Dip Coating Procedure:

Dip coating was done using a DSLR Camera Slider with an 80/20 Aluminum Rail Slide, Timing Belt, 1 RPM Gear Motor and Variable Speed Controller converted to a Vertical Dip-Coater with a dipping fixture to hold and stabilize the fused silica tubewells during dipping (FIG. 2) and set to a withdrawal rate of 0.0762 cm/s. To set the dip length of the fused silica tubewells, one was inserted into the dipping fixture with enough clearance for the slurry to be positioned under the tubewell tip without contact between the two. The stir plate was turned off and the slurry surface allowed to settle before the tubewell tip was adjusted to a position just above the non-stirring slurry surface. The tubewell was then removed from the dipping fixture to the drying fixture. The position of the dipping fixture was then lowered by 1" (or the desired coating length) and the position marked on the dip-coater. Fused silica tubewells were then placed in the dip coating fixture and plunged into the slurry; with variable dwell times. Once completely withdrawn from the slurry and clear of the surface, stirring of the slurry was restarted (lowest setting to achieve a slight vortex, no spitting). The tubewell was then removed into the drying fixture and allowed to dry for a minimum of 2 mins. The dip coating fixture was then lowered to the marked point and additional pieces of the same geometry were dipped.

Figure 3:
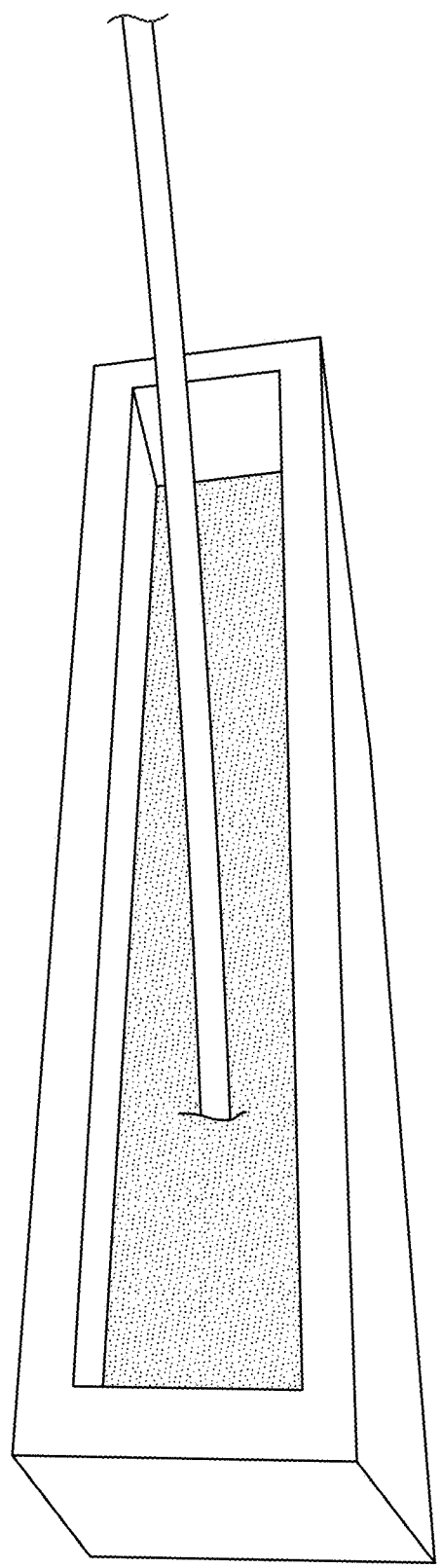
FIG. 3 shows an example of a manual coating process step, where a slurry preparation in a container receives an example substrate, i.e., fused silica sheath, for coating.
Figure 4:
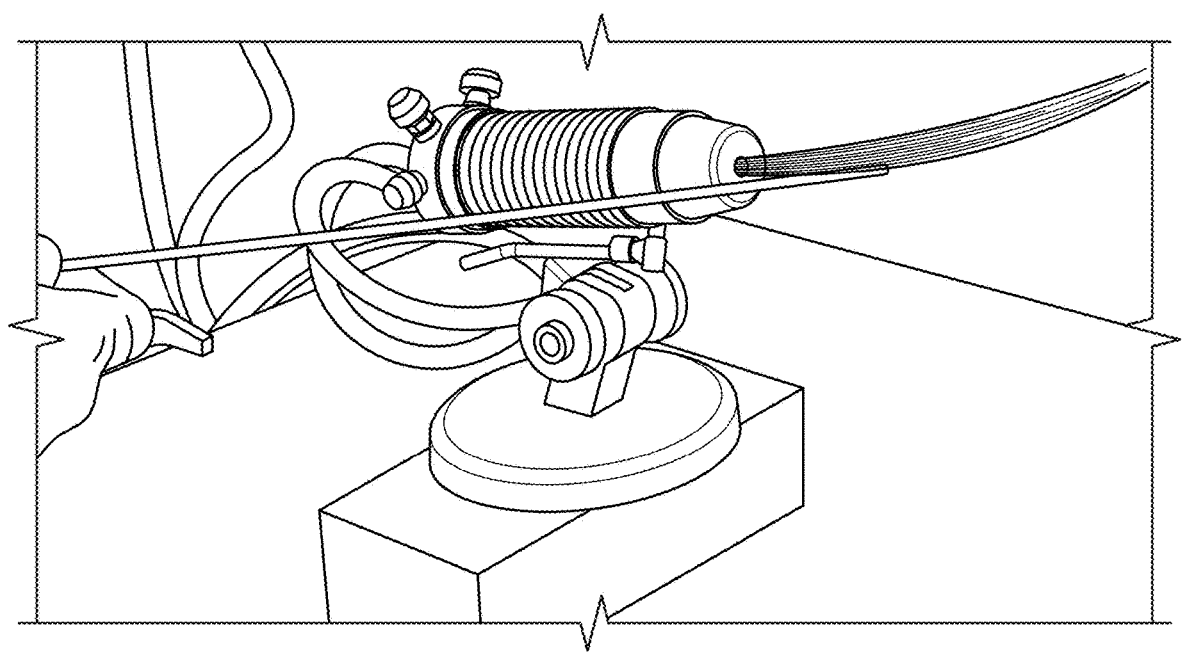
FIG. 4 shows an example of a manual heating process step in which an open flame is employed.
Figure 5:
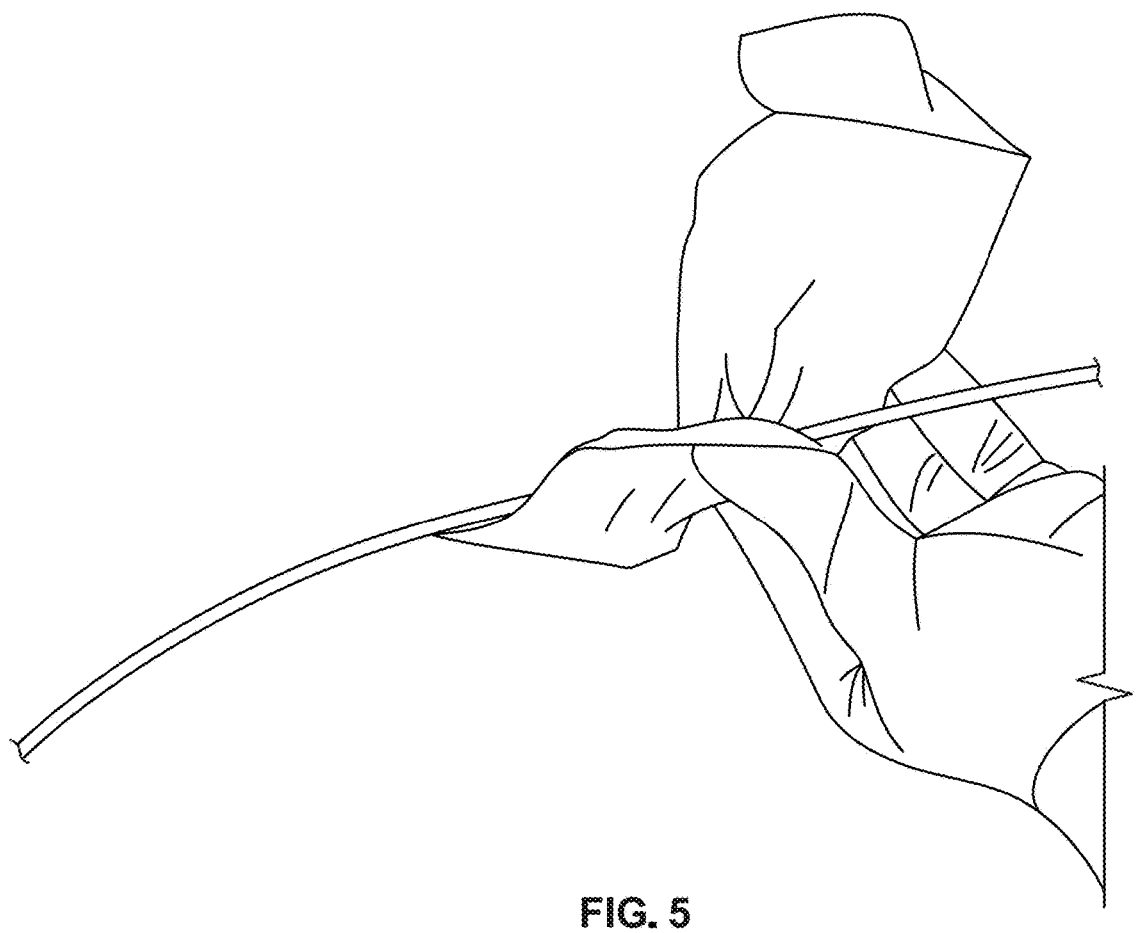
FIG. 5 shows an example of a fired substrate.
Figure 6:
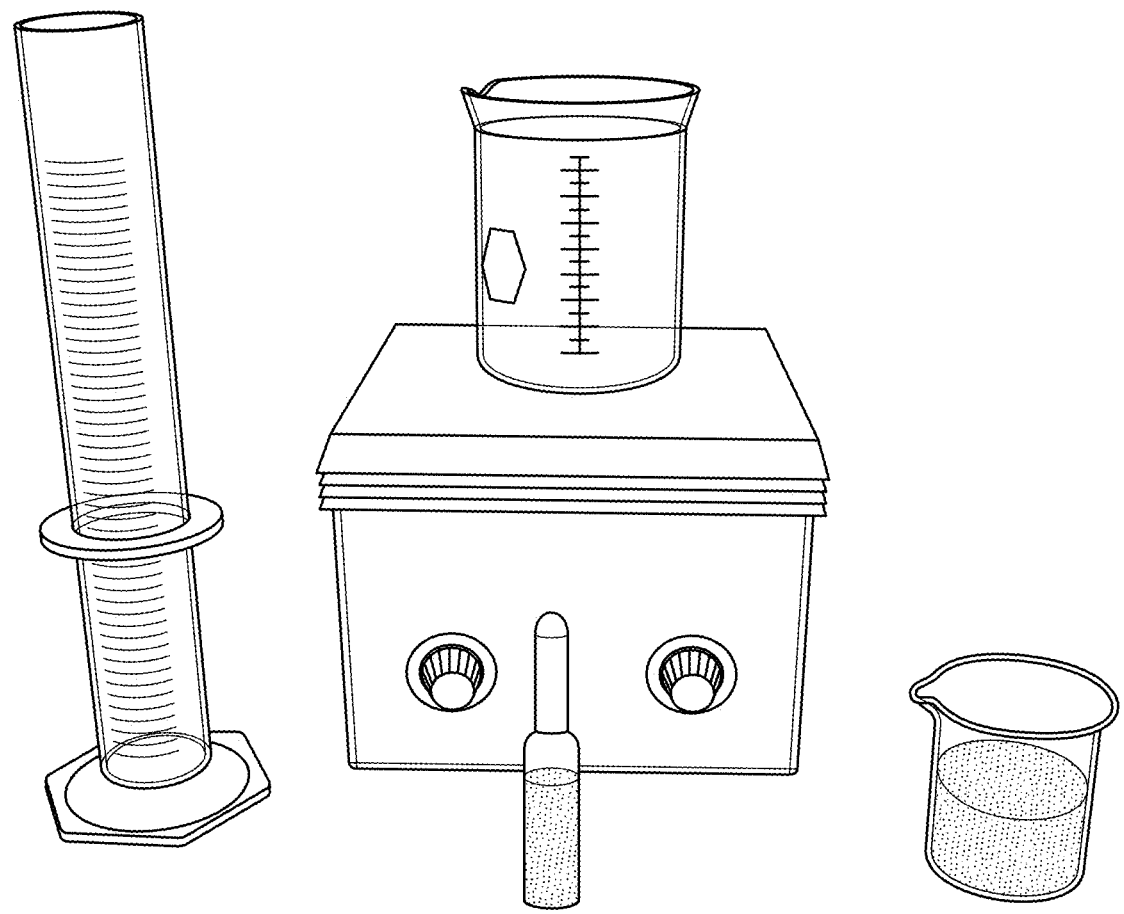
FIG. 6 shows a slurry preparation station under a fume hood.
Figure 7A:
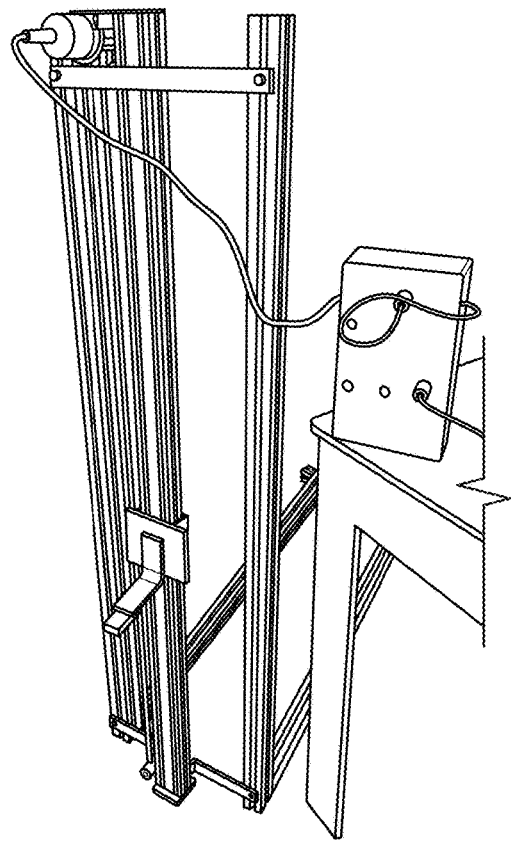
FIGS. 7A and 7B shows a dip coating station without and with the slurry set-up, respectively.
Figure 7B:
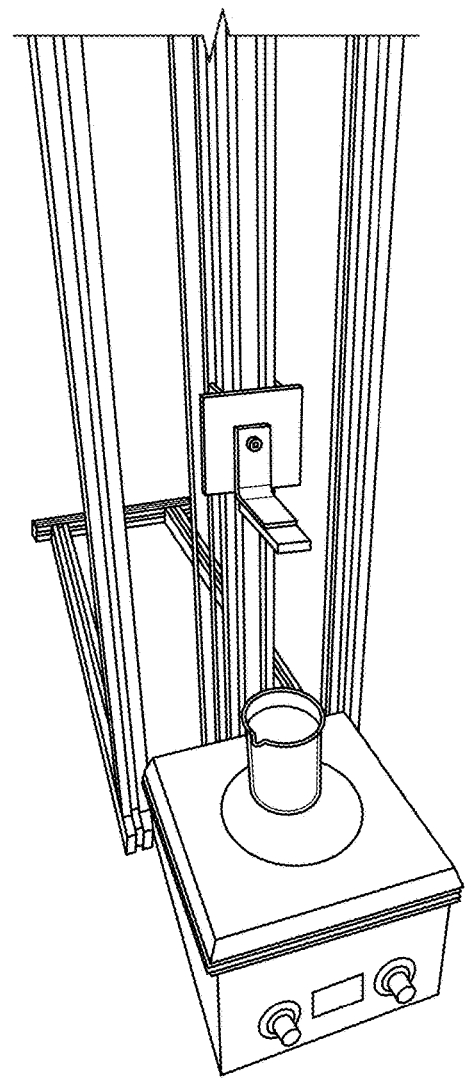
Figure 8A:
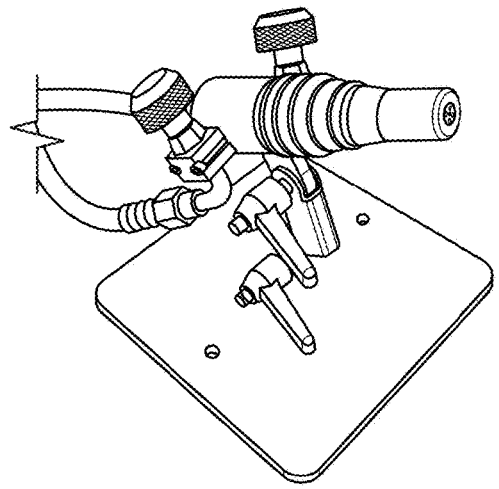
FIGS. 8A and 8B show a torch set-up and characteristic flame, respectively.
Figure 8B:
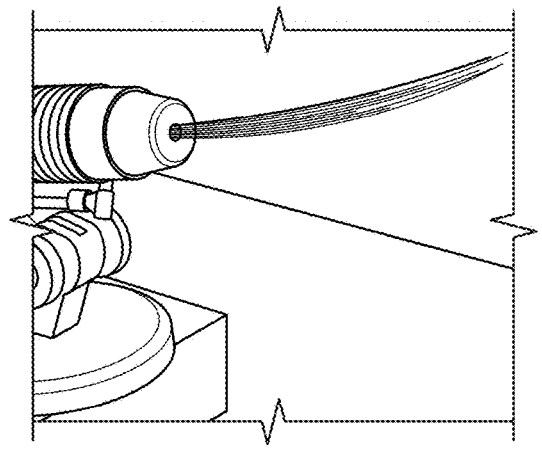
Figure 9A:
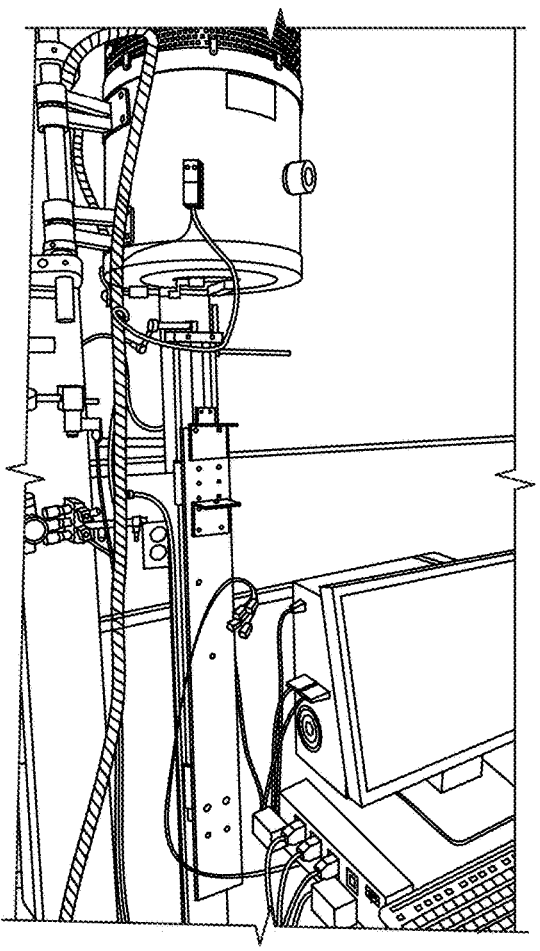
FIGS. 9A and 9B show a furnace firing station with the air slide in lower position with a coated tubewell ready for firing, and with the air slide engaged and firing of coated tubewell, respectively.
Figure 9B:
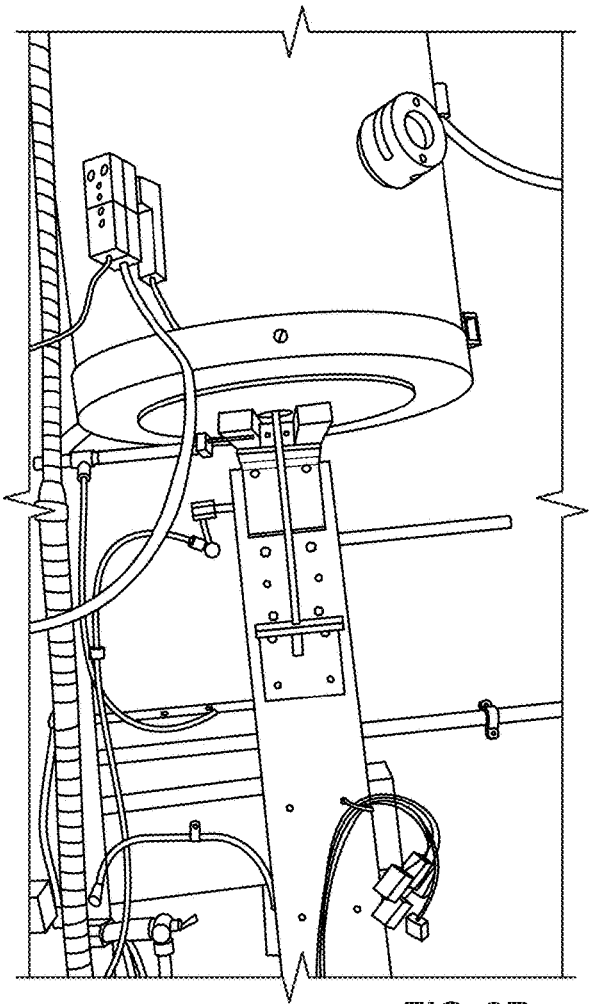
Figure 10:
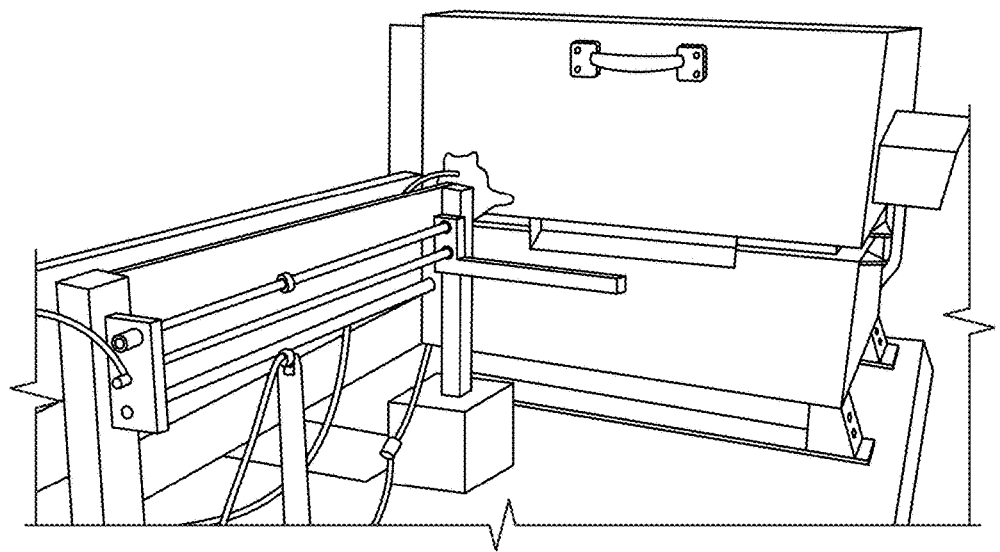
FIG. 10 shows a furnace firing station with an air slide.
Figure 11A:
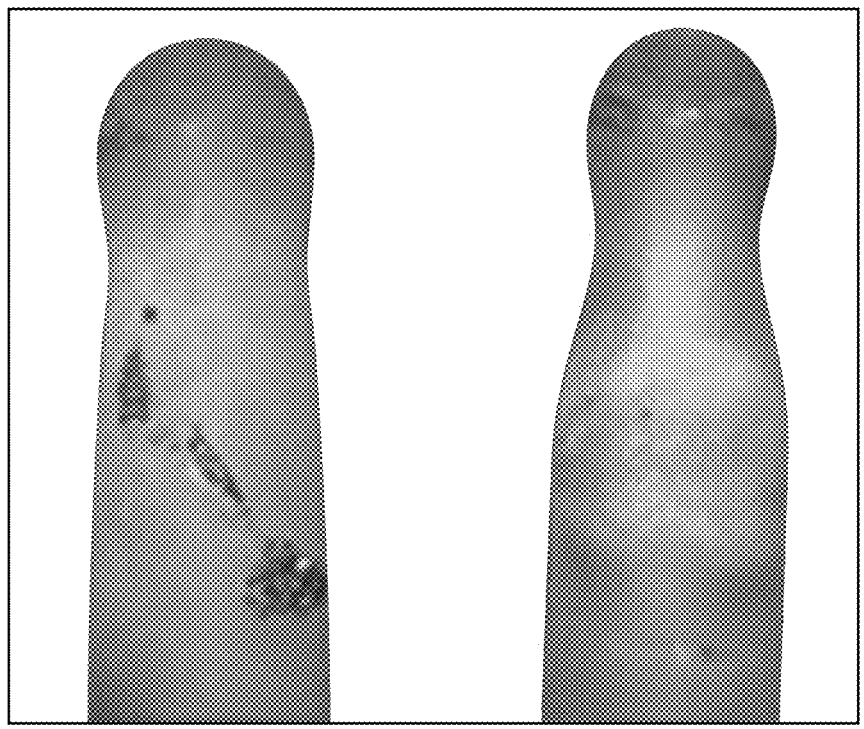
FIGS. 11A and 11B show thermocouples enclosed in fused silica provided with and without a barrier in accordance with the principles of this invention, respectively, after exposure to HCl in a high temperature environment in an ASM Epsilon® reactor.
Figure 11B:
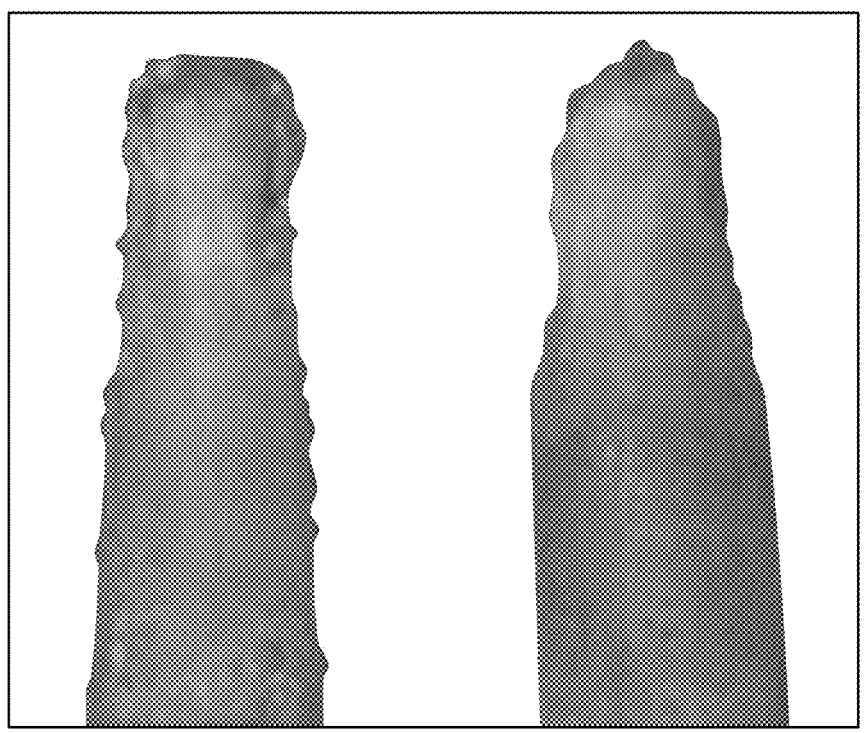

Firing Procedure:

Firing the coating onto the fused silica substrate was done through both flame firing and furnace firing. A benchtop Bethlehem Burners Alpha Glass Working Torch supplied with oxygen and methane was used to obtain a flame with a length ranging from 5"-10" appearing blue with some orange on the outer edges (FIG. 3). To fire the coated tubewell it was manually moved in and out of the flame while rotating about 2 cm away from the inner blue are for about 10 seconds. After firing, the torch was turned off and the coated fused silica tubewell moved to the drying fixture. Alternately, a (preheated) ATS Vertical Furnace with a Linear Air Slide and firing fixture to stabilize tubewells moving in and out of the furnace was used at temperatures from 500° C.-1600° C. at times from 20 seconds to 5 mins. The coated tubewell was placed in the furnace fixture, the air slide software was programed for the appropriate duration and started (FIG. 4). After firing the tubewell was removed to the drying fixture. Tubewells were cooled for a minimum of 5 mins. Once cooled additional layers of coating were applied by following the preceding steps. After the final coating layer was applied, dried and fired the tubewells were wiped with PROSAT wipes and allowed to dry, then covered to prevent contamination.

Example 3—Thermal and Process Compatibility of Coated Fused Silica Substrates

Thermal Shock Analysis: Fused silica tubewells with coatings applied as described in Example 1, having one, two or three layers of coating, were selected to simulate the fused silica thermocouple sheaths used in the semiconductor industry to protect thermoelements. Fused silica used for the tubewells has a relatively low CTE. When the tubewells are coated with one or more layers of coating, two types of interfaces may be created, an interface between the fused silica surface and the coating and interface(s) between the coating layers (multi-layer coatings). For best coating performance the coating should be continuous with the fused silica, continuous between layers and have a closely matched CTE to that of the fused silica. To evaluate continuity and any difference in CTE between the fused silica tubewell and the coating layer(s), coated tubewells were fired in various sequences (as noted in Example 1), with uncoated tubewells as controls. Thermal shock testing entailed inserting the coated tubewells, of the same geometry, into a Lindburg furnace at 550° C. for 30 mins; the tubewells were subsequently allowed to cool in air or quenched in water at room temperature. After quenching CTE matching was assessed through characteristics including coating hazing, crazing, spalling, delamination, and particle generation relative to the uncoated tubewells. None of the afore mentioned indications of a CTE mismatch occurred in any of the tubewells which indicated the coating was compatible with the fused silica substrate in each variation and poses minimal risk of contamination in semiconductor processes.

Thermal Cycling Analysis:

Within the semiconductor industry some processes occur at relatively high temperatures and under controlled atmospheres, for example, epitaxy often occurs at temperatures of 1150° C. or higher. To further evaluate the fused silica coating and coating layer interfaces in an environment relevant to the semiconductor industry coated fused silica tubewells were cycled at 1200° C. under vacuum. Fused silica tubewells were coated as described in Example 1, with one or three layers of coating, and were selected to simulate the fused silica thermocouple sheaths used in the semiconductor industry to protect the thermoelements. All tubewells were loaded into a room temperature Lindberg alumina tube (CoorsTek) furnace at atmospheric pressure on an alumina D-platform (CoorsTek). The furnace was sealed and evacuated to reach a vacuum of <10 mTorr (Edwards 8 pump). The furnace was then heated to 1200° C. over a period of 6 hrs and held for 24 brs then turned off and allowed to cool to room temperature. The furnace was brought back to atmospheric pressure and samples were removed based on the cycling requirements. The process was then repeated for each additional cycle up to 5. Tubewells were then analyzed for changes in coating characteristics such as hazing, crazing, spalling, delamination, and particle generation relative to the uncoated tubewells. Similar to the work with thermal shock, none of the tubewells exhibited the afore mentioned characteristics giving further indication of the robust nature of the fused silica-coating and the coating layer interfaces and their viability for use over large temperature ranges in semiconductor processing.

Evaluation of Coating Compatibility with Semiconductor Processing:

Thermal shock and cycling analysis proved the fused silica-coating and coating layer interfaces have the capability to maintain chemical and structural integrity over a wide temperature range and under vacuum. Within, the semiconductor industry, various temperatures and chemicals are used in the processing of semiconductor wafers, for example, strong acids, HCl, temperatures up to 1250° C., high velocity gas flows, and combinations thereof characterize typical reactor operating conditions in an Eplison® reactor chamber. In this environment erosion/corrosion of the affected region of the tubewells used to protect thermoelements in thermocouples that are essential for accurate control in these highly temperature sensitive processes, is a common cause of thermocouple failure. The erosion/corrosion of the tubewells leads to concerns for contamination of the reactor chamber and thus fused silica tubewells are used almost exclusively. Coating fused silica tubewells as described in Example 1 entails the use of the refractory metal Ta and therefore is a potential contaminant when erosion/corrosion is considered. Therefore, to assess contamination, both standard uncoated and standard coated tubewells (coated as described in Example 1), as well as coated tubewells (coated as described in Example 1) of modified geometry were used to assemble thermocouples for an Eplison® reactor. The thermocouples were then run in an Eplison® reactor under standard processing conditions (600° C.-1250° C., H2 gas, HCl gas, proprietary dopants) and wafers were monitored for contaminants. The operation of both standard coated thermocouples and coated thermocouples of modified geometry within the Eplison® reaction chamber, under typical operating conditions, did not cause contamination of the wafers. Upon removal from the Eplison® reactor, optical inspection confirmed that during the service life of the thermocouples the region commonly affected by erosion/corrosion, also being the coated region of the tubewells, was affected. However, in contrast to the severe pitting erosion/corrosion typically observed on uncoated thermocouples, a moderate smooth erosion/corrosion occurred on the coated thermocouples. Therefore, while erosion/corrosion of the coated thermocouple was occurring, it was occurring to a lesser degree and without risk of wafer contamination.

Analysis of Coated Thermocouple Service Life:

In addition to evaluating the contamination and erosion/corrosion, the experiment described in the previous paragraph [0111] was used to obtain an estimation of the performance in terms of service life of coated thermocouples in comparison to uncoated thermocouples. Records of the optical tubewell appearance, reason for removal from reactor, working condition at time of removal, and a breakdown of the total hours in service by processing condition as well as number of cycles in service were compiled after all thermocouples were run in the Eplison® reactor. Under the Eplison® reactor operating conditions the uncoated thermocouples were removed in both operating and with open circuit(s). Uncoated tubewell/sheaths typically are preferentially attacked at various nucleation points such as: inclusions, scratches, chips, or cracks on the exterior surface. This results in non-uniform erosion of the fused silica material which can cause pin-holes and severe pitting as seen on the uncoated tubewells/sheaths. Each standard coated thermocouple was still in operating condition upon removal, had only moderate smooth erosion/corrosion and showed a 300% increase in the number of service cycles (compared with the uncoated thermocouples). While both standard uncoated and coated thermocouples were removed in operating condition the reduced and more uniform erosion allows for the coated thermocouples to be used not only for longer run times but also provides for extended planned maintenance schedules with greater predictability.

The present disclosure is not to be limited in terms of the particular embodiments described in this application. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 filler materials refers to groups having 1, 2, or 3 filler materials. Similarly, a group having 1-5 filler materials refers to groups having 1, 2, 3, 4, or 5 of such filler materials, and so forth.

While various aspects and illustrative embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

All references cited herein are incorporated by reference herein in their entireties and for all purposes to the same extent as if each individual publication, patent, or patent application was specifically and individually incorporated by reference in its entirety for all purposes.

The invention claimed is:

1. An improved fused silica surfaced apparatus for use in the high temperature acid environment of a chemical vapor deposition reaction chamber used for semiconductor processing, the improvement comprising an alumina-free coating comprising a tantalum compound barrier on the fused silica surface, the barrier sufficient to resist erosion of the fused silica at temperatures in excess of 1000° C. in the presence of hydrochloric acid.

2. The improved fused silica surfaced apparatus of claim 1, wherein the apparatus is one of a thermocouple, a spider, chamber wall, or other fused silica apparatus used in chip fabrication.

3. The improved fused silica surfaced apparatus of claim 1, wherein the barrier is sufficient to resist erosion at temperatures in excess of 1150° C. in the presence of hydrochloric acid.

4. The improved fused silica surfaced apparatus of claim 3, wherein the barrier is sufficient to resist erosion at temperatures in excess of 1250° C. in the presence of hydrochloric acid.

5. The improved fused silica surfaced apparatus of claim 1 wherein the coating is applied by the process of applying a mixture of (i) at least one tantalum compound, (ii) at least one thixotropic matrix component; and (iii) an inert solvent, to the fused silica surface, and thermochemically reacting the mixture to form the barrier.

6. The improved fused silica surfaced apparatus of claim 5 wherein the mixture has a pH less than or equal to 2 at application.

7. The improved fused silica surfaced apparatus of claim 5 wherein the tantalum compound is selected from the group consisting of tantalum carbide compounds ($TaC_x$), $TaB_2$, $Ta_4HfC_5$, TaN, tantalum pentafluoride ($TaF_5$), tantalum pentaiodide ($Ta_2I_{10}$), tantalum pentoxide ($Ta_2O_5$), tantalum telluride ($TaTe_2$), tantalum(III) aluminide ($TaAl_3$), tantalum (IV) sulfide ($TaS_2$), tantalum(V) bromide ($Ta_2Br_{10}$), tantalum(V) ethoxide ($Ta_2(OC_2H_5)_{10}$), tantalum(V) chloride ($TaCl_5$), $TaO_2$, $TaCl_4$, and $Ta_3Al$, and combinations thereof.

8. The improved fused silica surfaced apparatus of claim 7, wherein the tantalum compound is tantalum(V) chloride ($TaCl_5$).

9. The improved fused silica surfaced apparatus of claim 7, wherein the at least one thixotropic matrix component comprises a silicate compound.

10. The improved fused silica surfaced apparatus of claim 9, wherein the silicate compound is fumed silica.

11. The improved fused silica surfaced apparatus of claim 9, wherein the inert solvent is ultra-pure water.

12. The improved fused silica surfaced apparatus of claim 11, wherein the ratio of components (i):(ii) is about 3:1 by weight.

13. The improved fused silica surfaced apparatus of claim 11, wherein the ratio of components (i):(iii) is about 75:25 by weight percentage, and wherein component (i) is tantalum(V) chloride ($TaCl_5$) and component (ii) is fumed silica.

14. The improved fused silica surfaced apparatus of claim 13, wherein the weight by solids in the inert solvent is about 13% w/v, and wherein the inert solvent is ultra-pure water.

15. The improved fused silica surfaced apparatus of claim 14, wherein the barrier has a coefficient of thermal expansion similar to that of the fused silica surface to which it is applied.

16. The improved fused silica surfaced apparatus of claim 1 wherein the barrier comprises multiple layers.

17. The improved fused silica surfaced apparatus of claim 1 wherein the barrier has thickness of about 5 and about 20 µm.

18. A method of applying an aluminum-free coating comprising a protective barrier to a fused silica surfaced apparatus used in a chemical vapor deposition reaction chamber for semiconductor processing, the method comprising:
applying a mixture of (i) at least one tantalum compound, (ii) at least one thixotropic matrix component; and (iii) an inert solvent, to the fused silica surface, and thermochemically reacting the mixture to form the barrier sufficient to resist devitrification at temperatures in excess of 1000° C. in the presence of hydrochloric acid.

19. The method according to claim 18 wherein the mixture has a pH less than or equal to 3 at application.

20. The method according to claim 18 wherein the tantalum compound is selected from the group consisting of tantalum carbide compounds ($TaC_x$), $TaB_2$, $Ta_4HfC_5$, TaN, tantalum pentafluoride ($TaF_5$), tantalum pentaiodide ($Ta_2I_{10}$), tantalum pentoxide $Ta_2O_5$, tantalum telluride ($TaTe_2$), tantalum(III) aluminide ($TaAl_3$), tantalum(IV) sulfide ($TaS_2$), tantalum(V) bromide ($Ta_2Br_{10}$), tantalum(V) ethoxide ($Ta_2(OC_2H_5)_{10}$), tantalum(V) chloride ($TaCl_5$), $TaO_2$, $TaCl_4$, and $Ta_3Al$, and combinations thereof.

21. The method according to claim 20, wherein the tantalum compound is tantalum(V) chloride ($TaCl_5$).

22. The method according to claim 21, wherein the at least one thixotropic matrix component comprises a silicate compound.

23. The method according to claim 22, wherein the silicate compound is fumed silica.

24. The method according to claim 23, wherein the inert solvent is ultra-pure water.

25. The method according to claim 23, wherein the ratio of components (i):(ii) is about 3:1 by weight.

26. The method according to claim 24, wherein the ratio of components (i):(iii) is about 75:25 by weight percentage, and wherein component (i) is tantalum(V) chloride ($TaCl_5$) and component (ii) is fumed silica.

27. The method according to claim 25, wherein the weight by solids in the inert solvent is about 13% w/v, and wherein the inert solvent is ultra-pure water.

* * * * *